United States Patent [19]

Shahamat et al.

[11] Patent Number: 5,166,564
[45] Date of Patent: Nov. 24, 1992

[54] ROTATING RECTIFIER ASSEMBLY

[75] Inventors: Mohammad Shahamat; Michael R. Hernden; Frank W. Allen, III, all of Rockford, Ill.

[73] Assignee: Sundstrand Corporation, Rockford, Ill.

[21] Appl. No.: 505,137

[22] Filed: Apr. 5, 1990

[51] Int. Cl.$^5$ .............................................. H02K 11/00
[52] U.S. Cl. ............................... 310/68 D; 310/68 R; 310/42; 310/71
[58] Field of Search .................... 310/68 D, 68 R, 42, 310/71

[56] References Cited

U.S. PATENT DOCUMENTS

| | | | |
|---|---|---|---|
| 3,980,910 | 9/1976 | Steinebronn | 310/71 |
| 4,482,827 | 11/1984 | Baldwin | 310/68 D |
| 4,570,094 | 2/1986 | Trommer | |
| 4,581,695 | 6/1986 | Hoppe | 310/68 D |
| 4,594,523 | 6/1986 | Horita | 310/42 |
| 4,603,344 | 7/1986 | Trommer | 310/68 D |
| 4,621,210 | 4/1986 | Krinickas, Jr. | |
| 4,628,219 | 12/1986 | Troscinski | 310/68 D |

Primary Examiner—Steven L. Stephan
Assistant Examiner—Romeo M. Dougherty
Attorney, Agent, or Firm—Wood, Phillips, VanSanten, Hoffman & Ertel

[57] ABSTRACT

The problem of assembling and maintaining good electrical contact in a rotating rectifier assembly (40) is solved using brazed connections. The rectifier assembly (40) includes a cylindrical housing (44) receiving a pair of coaxial copper plates (50,52) which act as outputs. Each copper plate (50,52) has three angularly spaced, square-shaped diode wafers (64,70) brazed thereto on one face. The opposite face of each diode wafer (64,70) is brazed to a conductive strap (68,74). The straps (68,74) extend radially outwardly. The two plates (50,52) are angularly aligned so that their respective diode wafers (64,70) are in angular alignment, with the straps (68,74) for the aligned diode wafers (64,70) of each plate (50,52) being soldered together to provide a phase connection. A conductive strap (58,60) is brazed to each of the two plates (50,52) for connection to conductive posts (48) which connect to the main field (32).

14 Claims, 2 Drawing Sheets

ROTATING RECTIFIER ASSEMBLY

FIELD OF THE INVENTION

This invention relates to a dynamoelectric machine and, more particularly, to a rotating rectifier assembly therefor.

BACKGROUND OF THE INVENTION

In one known form, a dynamoelectric machine comprises a generator for use in aircraft. Such a generator may include a main generator, a rotating rectifier bridge assembly, an exciter and a permanent magnet generator (PMG). Each of the main generator, exciter and PMG include a rotor driven via a common shaft. The PMG is a pilot generator used to develop output power which is rectified to provide excitation to an exciter stator winding. The exciter rotor carries a three phase AC armature winding connected through the rotating rectifier assembly to a DC field winding of the main generator to develop three phase output power in a stator armature winding.

A typical rotating bridge rectifier assembly is illustrated in Troscinski U.S. Pat. No. 4,628,219. This rectifier assembly includes a tubular housing receiving a stack of plates sandwiching diode wafers. Because of the sandwiching structure, the housing must be of a sufficient length to accommodate the same. This requirement is in conflict with the need to minimize the size and weight of components in an aircraft. Further, such a device can be difficult to assemble.

One alternative form of a rotating rectifier assembly is illustrated in Trommer U.S. Pat. No. 4,570,094 which discloses the diode wafers being angularly spaced in two parallel planes. The diodes are sandwiched between conductor plates which are held under compression by a biasing device to assure good electrical contact between the various components while occupying a minimum space and minimizing the overall weight of the assembly. Thus, this device relies on clamping forces in order to maintain electrical contact. Further, such a device can be difficult to assemble.

The present invention is directed to overcoming one or more of the problems as set forth above.

SUMMARY OF THE INVENTION

In accordance with the present invention, a rectifier assembly is provided with brazing means for rigidly securing diode wafers to conductive plates.

Broadly, there is disclosed herein a rectifier assembly including first and second conductive output plates each having opposite surfaces. Insulating means mount the conductive output plates in parallel, axially spaced relationship to a central axis. A plurality of first and second diode wafers are provided. Brazing means rigidly secure each of the first diode wafers to one of the surfaces of the first output plate and each of the second diode wafers to one of the surfaces of the second output plate. A plurality of first and second conductors, one for each diode wafer, are electrically connected to the respective first and second diode wafers. Soldering means electrically connect each of the first conductors to one of the second conductors to thereby define a plurality of phase connections. Input terminal means are provided for electrically connecting each phase connection to a respective phase of an AC input source. Output terminal means are provided for electrically connecting each output plate to a point of use.

It is a feature of the invention that the diode wafers are equally angularly spaced about the axis.

It is another feature of the invention that the insulated means mount the output plates with the first and second diode wafers in angular alignment.

It is still another feature of the invention that the diode wafers are square-shaped.

It is still a further feature of the invention that the conductors comprise flat conductive straps soldered to the diode wafers.

In accordance with another aspect of the invention the rectifier assembly includes a plurality of supports brazed to the output plates adjacent each diode wafer with each of the conductors soldered to one of the supports.

It is yet another feature of the invention that the output terminal means comprise a pair of straps each brazed to one of the output plates.

In accordance with another aspect of the invention, the rotating rectifier assembly is provided for a dynamoelectric machine operable to rectify three phase AC power to DC power. The assembly comprises first and second conductive output plates each having opposite surfaces. Insulating means mount the conductive output plates in parallel, axially spaced relationship to a central axis. A plurality of first and second diode wafers are provided, three for each phase. Brazing means rigidly secure each of the first diode wafers to one of the surfaces of the first output plate and each of the second diode wafers to one of the surfaces of the second output plate. A plurality of first and second conductors, one for each diode wafer, are electrically connected to the respective first and second diode wafers. Soldering means electrically connect each of the first conductors to one of the second conductors to thereby define three phase connections. Input terminal means are provided for electrically connecting each phase connection to a respective phase of an AC input source. Output terminal means are provided for electrically connecting each output plate to a point of use.

The disclosed diode package is particularly suited for use in a rotating dynamoelectric machine such as a generator. Particularly, the diode package comprises a full wave rectifier which rectifies three phase AC power developed in an exciter to DC power for powering the field of a main generator.

The diode package includes a cylindrical housing receiving a pair of co-axial copper plates which act as outputs. Each copper plate has three angularly spaced, square-shaped diode wafers brazed thereto on one face. The opposite face of each diode wafer is brazed to a conductive strap. The strap extends radially outwardly. The two plates are angularly aligned so that their respective diode wafers are in angular alignment, with the strap for the aligned diode wafers of each plate being soldered together to provide a phase connection. A conductive strap is brazed to each of the two plates for connection to conductive posts which connect to the main field.

The square shaped diode wafers provides a larger voltage rating than that provided with conventional circular diode wafers. Specifically, a rating of 1600 volts is provided, as opposed to a rating of 600 volts. Further, a support is provided radially outwardly of each diode wafer and also brazed to the strap to decrease the loading on the silicone in the diode wafer.

Further features and advantages of the invention will readily be apparent from the specification and from the drawings.

DETAILED DESCRIPTION OF THE INVENTION

Figure 1:
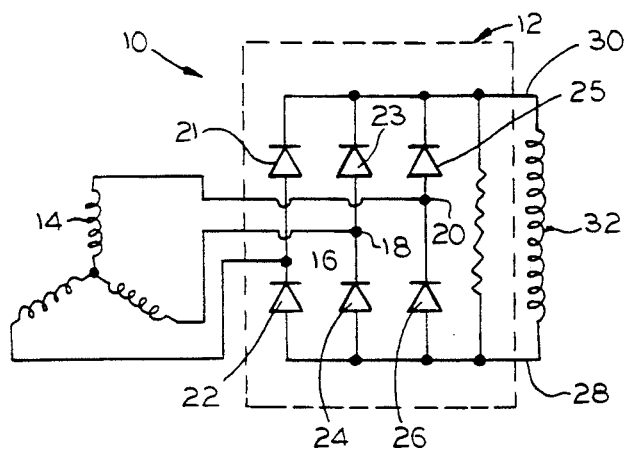
FIG. 1 is a schematic diagram of a rotating rectifier assembly employed in a generator.
Figure 2:
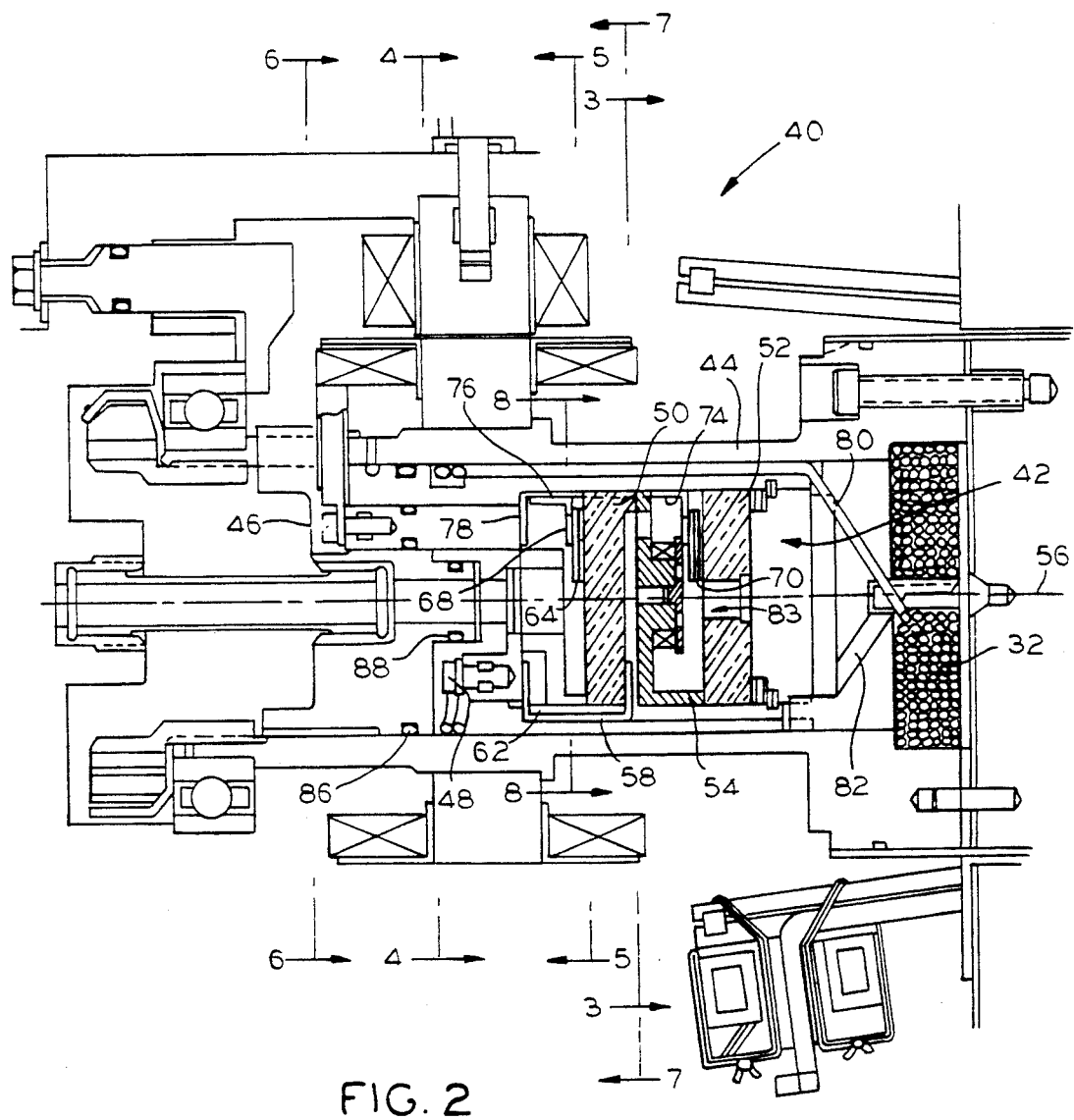
FIG. 2 is an enlarged sectional view of a rectifier assembly according to the invention taken along the line 2—2 of FIG. 4.

With reference to FIG. 1, a schematic diagram illustrates a portion of a brushless generator 10 including a rotating rectifier bridge assembly 12. Although the complete generator 10 is not illustrated herein, such a generator, as discussed above, may include an exciter including a three phase rotor armature winding 14 which develops three phase AC power supplied to junctions 16, 18 and 20 of the rectifier assembly 12. The rectifier assembly 12 includes six diodes 21-26 connected in a bridge configuration to the junctions 16, 18 and 20 to develop DC output power at opposite rails 28 and 30. The DC power is provided to a DC rotor field winding 32 of a main generator (not shown).

Each of the windings 14 and 32 and rectifier assembly 12 are mounted in a rotor in the brushless power generator. The polyphase voltage developed in the exciter armature winding 14, caused by rotation of the rotor is rectified by the rectifier assembly 12 to power the main field winding 32 which is used to develop AC output power, as is well known.

With reference to FIGS. 2-9, there is illustrated a rotating rectifier bridge assembly 40 according to the invention. Specifically, the rectifier assembly 40 is operable to rectify three phase AC power to DC power, as discussed above.

Figure 4:
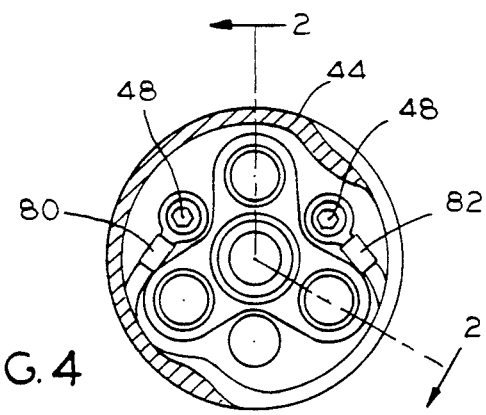
FIG. 4 is a sectional view taken along the line 4—4 of FIG. 2.
Figure 3:
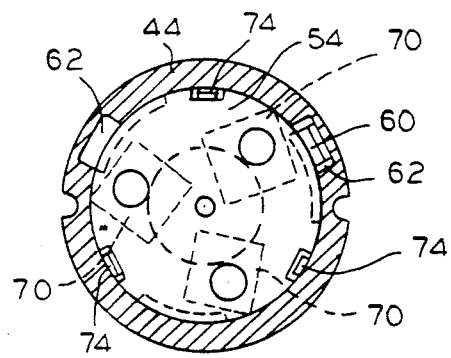
FIG. 3 is a sectional view taken along the line 3—3 of FIG. 2.
Figure 6:
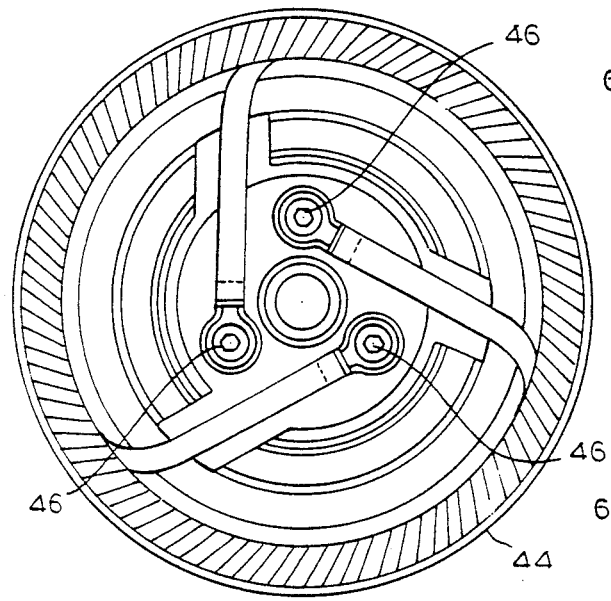
FIG. 6 is a sectional view taken along the line 6—6 of FIG. 2.
Figure 5:
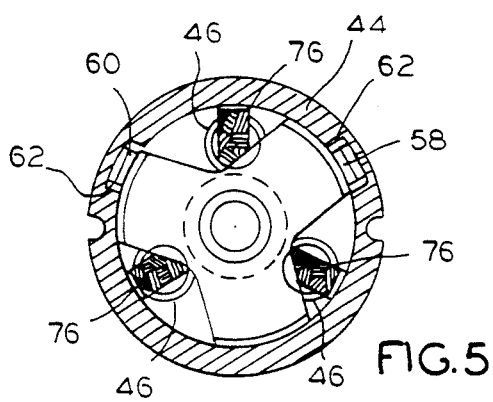
FIG. 5 is a sectional view taken along the line 5—5 of FIG. 2.
Figure 7:
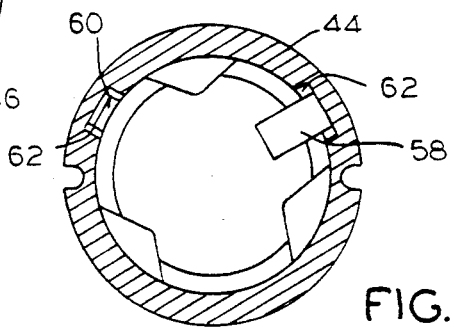
FIG. 7 is a sectional view taken along the line 7—7 of FIG. 2.

The rectifier assembly 40 includes a rectifier subassembly 42 housed in a tubular, or cylindrical housing 44 and including input terminals 46 extending axially from the housing 44 at one end, see FIG. 6, and output terminals 48, see FIG. 4, extending axially from the housing 44 at the same end. The input terminals 46 are used for electrically connecting the subassembly 42 to the respective phases of an AC power source, such as the winding 14, see FIG. 1. Similarly, the output terminals 48 are used for electrically connecting the rectifier subassembly 42 to a point of use, such as the DC field winding 32, see FIG. 2.

The rectifier subassembly 42 includes a pair of generally circular, conductive output plates 50 and 52. An insulating spacer 54 is disposed between the output plates 50 and 52 to maintain the same in parallel, axially spaced relationship about a central axis represented by a line 56. The output plates 50 and 52 are connected via respective conductive output straps 58 and 60 to the output terminals 48. Particularly, the straps 58 and 60 are electrically connected, as by brazing, to both the respective output plates 50 and 52 and the output terminals 48. The straps 58 and 60 are routed via notches 62 within the inner wall of the tubular housing 44. The first strap 58 is particularly illustrated in FIG. 2 and comprises a flat, elongated strap formed in a U-configuration with one leg secured to the first output plate 50, the cross portion extending through the notch 62, and the other leg connected to the terminal 48. Although not specifically illustrated, the second strap 60 is generally similar, albeit longer due to the greater axial spacing between the second output plate 52 and the output terminals 48.

The first output plate 50 includes three angularly spaced, square-shaped diode wafers 64 brazed thereto on one of its two opposite faces. Also brazed to the plate adjacent each diode 64 is a support 66, see FIG. 9. An elongate, flat copper strap 68 is soldered to each diode wafer 64 and associated support 66. Particularly, the strap 68 is used to provide an electrical connection to the diode wafer 64. The support 66 is used to minimize strain on the connection between the strap 68 and diode wafer 64. Similarly, three angularly spaced, square-shaped diode wafers 70 are brazed to the second output plate 52, along with adjacent support 72. A copper strap 74 is soldered to each diode wafer 70 and its adjacent associated support 72.

Figure 9:
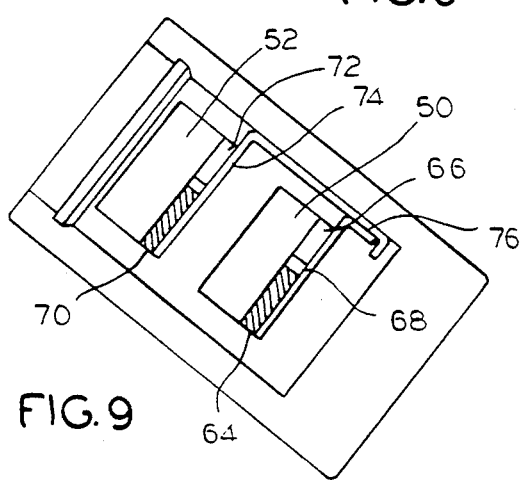
FIG. 9 is a sectional view taken along the line 9—9 of FIG. 8.
Figure 8:
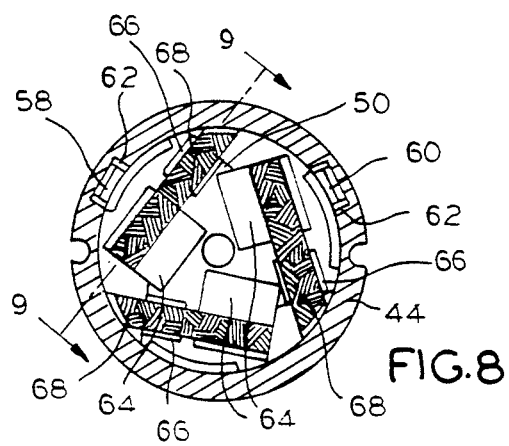
FIG. 8 is a sectional view taken along the line 8—8 of FIG. 2.

As is particularly illustrated in FIG. 9, each of the straps 74 associated with the second output plate 52 is soldered to one of the straps 68 associated with the first output plate 50, as at 76. Each of the straps 74 continues beyond the connection point 76 and is connected as at 78 to one of the input terminals 46, see FIG. 2. Resultantly, each input terminal 46, representing the three junctions, 16, 18 and 20, see FIG. 1, is connected to one each of the first diode wafers 64 and the second diode wafers 70.

As is apparent from the above, AC power applied at the input terminals 46 is rectified by the connected pairs of first and second diode wafers 64 and 70 to develop DC power across the output plates 50 and 52, which are connected Via the straps 58 and 60 to the output terminals 48. The output terminals 48 are in turn connected by electrical conductors 80 and 82 to the DC field winding 32, see FIG. 1.

The use of square-shaped diode wafers, as compared to conventional circular diode wafers, provides a higher voltage rating. Particularly, a typical circular diode wafer has a voltage rating of approximately 600 volts, while the square-shaped diode wafers have a voltage rating on the order of 1,600 volts. Thus, for a given application, the size of the diodes may be made smaller and thus the overall package would be smaller and weigh less, which is important in an application such as an aircraft.

In order to dissipate heat in the rectifier assembly 42, the output plates 50 and 52, to which the diode wafers 64 and 70 are brazed, act as a heat sink to more rapidly dissipate heat. In addition, further cooling may be provided by the use of oil cooling whereby the oil is permitted to flow through spaces provided within the housing, including a central aperture 84 provided through the second output plate 52 which allows oil to flow directly over each of the diode wafers 70 disposed between the output plates 50 and 52. However, suitable seals such as O-ring seals 86 and 88 prevent oil from entering areas occupied by the terminals 46 and 48.

Thus, in accordance with the invention, a rectifier assembly includes a plurality of diode wafers secured as by brazing to a pair of parallel axially spaced output plates. Diode pairs for each output plate are interconnected using copper straps brazed to each diode wafer and then soldered together. Thus, the assembly does not rely on compressive forces to maintain proper electrical conduction to improve efficiency and reliability.

The illustrated embodiment of the invention is illustrative of the broad inventive concepts comprehended.

We claim:

1. A rectifier assembly comprising:
    first and second conductive output plates;
    insulated means mounting said conductive output plates in parallel, axially spaced relationship about a central axis;
    a plurality of first and second diode wafers;
    brazing means for rigidly securing said first diode wafers to one surface of said first output plate and said second diode wafers to one surface of said second output plate each said surface being normal to said axis;
    a plurality of first and second electrical conductors, one for each said diode wafer, each said first conductor being electrically connected to one of said first diode wafers, and each said second conductor being electrically connected to one of said second diode wafers;
    soldering means for electrically connecting each of said first conductors to one of said second conductors to thereby define a plurality of phase connections;
    input terminal means for electrically connecting each said phase connection to a respective phase of an AC input source; and
    output terminal means for electrically connecting each said output plate to a point of use.

2. The rectifier assembly of claim 1 wherein said first diode wafers are equally angularly spaced about said axis on said first output plate and said second diode wafers are equally angularly spaced about said axis on said second output plate.

3. The rectifier assembly of claim 1 wherein said insulated means mounts said first and second output plates with said first and second diode wafers in angular alignment.

4. The rectifier assembly of claim 1 wherein said conductors comprise flat conductive straps.

5. The rectifier assembly of claim 1 further comprising a plurality of supports brazed to said output plates adjacent each said diode wafer, each said conductor being soldered to one of said supports.

6. The rectifier assembly of claim 1 wherein said diode wafers are square-shaped.

7. The rectifier assembly of claim 1 wherein said output terminal means comprise a pair of straps each brazed to one of said output plates.

8. A rotating rectifier assembly for a dynamoelectric machine operable to rectify three phase AC power to DC power, comprising:
    first and second conductive output plates;
    insulated means mounting said conductive output plates in parallel, axially spaced relationship about a central axis;
    a plurality of first and second diode wafers, three for each said output plate;
    brazing means for rigidly securing said first diode wafers to one surface of said first output plate and said second diode wafers to one surface of said second output plate each said surface being normal to said axis;
    a plurality of first and second electrical conductors, one for each said diode wafer, each said first conductor being electrically connected to one of said first diode wafers, and each said second conductor being electrically connected to one of said second diode wafers;
    soldering means for electrically connecting each of said first conductors to one of said second conductors to thereby define three phase connections;
    input terminal means for electrically connecting each said phase connection to a respective phase of a three phase AC input source; and
    output terminal means for electrically connecting each said output plate to a point of use.

9. The rectifier assembly of claim 8 wherein said first diode wafers are equally angularly spaced about said axis on said first output plate and said second diode wafers are equally angularly spaced about said axis on said second output plate.

10. The rectifier assembly of claim 8 wherein said insulated means mounts said first and second output plates with said first and second diode wafers in angular alignment.

11. The rectifier assembly of claim 8 wherein said conductors comprise flat conductive straps.

12. The rectifier assembly of claim 8 further comprising a plurality of supports brazed to said output plates adjacent each said diode wafer, each said conductor being soldered to one of said supports.

13. The rectifier assembly of claim 8 wherein said diode wafers are square-shaped.

14. The rectifier assembly of claim 8 wherein said output terminal means comprise a pair of straps each brazed to one of said output plates.

* * * * *